United States Patent
Zou

(10) Patent No.: US 10,586,886 B2
(45) Date of Patent: Mar. 10, 2020

(54) MICRO-LED TRANSFER METHOD AND MANUFACTURING METHOD

(71) Applicant: Goertek Inc., Weifang (CN)

(72) Inventor: Quanbo Zou, Weifang (CN)

(73) Assignee: GOERTEK, INC., Weifang (CN)

( * ) Notice: Subject to any disclaimer, the term of this patent is extended or adjusted under 35 U.S.C. 154(b) by 0 days.

(21) Appl. No.: 16/071,451

(22) PCT Filed: Jan. 20, 2016

(86) PCT No.: PCT/CN2016/071474
§ 371 (c)(1),
(2) Date: Jul. 19, 2018

(87) PCT Pub. No.: WO2017/124332
PCT Pub. Date: Jul. 27, 2017

(65) Prior Publication Data
US 2019/0027642 A1    Jan. 24, 2019

(51) Int. Cl.
*H01L 33/00* (2010.01)
*H01L 33/48* (2010.01)
*H01L 25/075* (2006.01)
*H01L 23/00* (2006.01)

(52) U.S. Cl.
CPC ...... *H01L 33/0095* (2013.01); *H01L 25/0753* (2013.01); *H01L 33/48* (2013.01); *H01L 24/83* (2013.01); *H01L 24/96* (2013.01); *H01L 2221/68322* (2013.01); *H01L 2224/83005* (2013.01)

(58) Field of Classification Search
CPC ... H01L 33/486; H01L 33/502; H01L 33/505; H01L 33/507; H01L 33/54; H01L 33/56; H01L 2933/0041; H01L 2933/005
See application file for complete search history.

(56) References Cited

U.S. PATENT DOCUMENTS

| | | | |
|---|---|---|---|
| 7,241,707 B2 * | 7/2007 | Meagley | H01L 21/0276 257/E21.026 |
| 8,003,427 B2 * | 8/2011 | Faraone | G02B 26/001 250/338.1 |
| 2017/0170049 A1 * | 6/2017 | Hu | H01L 25/0753 |

FOREIGN PATENT DOCUMENTS

| | | |
|---|---|---|
| CN | 101071777 A | 11/2007 |
| CN | 101728288 A | 6/2010 |
| CN | 101755031 A | 6/2010 |

(Continued)

OTHER PUBLICATIONS

State Intellectual Property Office of the Peoples Republic of China, International Search Report for International Application No. PCT/CN2016/071474, dated Jul. 14, 2016.

*Primary Examiner* — Zandra V Smith
*Assistant Examiner* — Andre C Stevenson
(74) *Attorney, Agent, or Firm* — Rimon PC

(57) ABSTRACT

A micro-LED (3r) transfer method and a manufacturing method are disclosed. The micro-LED (3r) transfer method comprises: forming a sacrificial post (4) on a micro-LED (3r) to be picked-up on a carrier substrate (1); bonding the micro-LED (3r) to be picked-up with a pickup substrate (5) via the sacrificial post (4); lifting-off the micro-LED (3r) to be picked-up from the carrier substrate (1); bonding the micro-LED (3r) on the pickup substrate (5) with a receiving substrate (12); and lifting-off the micro-LED (3r) from the pickup substrate (5). A complicated pickup head is not necessary, and the technical solution is relatively simple.

9 Claims, 6 Drawing Sheets

(56) References Cited

FOREIGN PATENT DOCUMENTS

| CN | 101933070 A | 12/2010 |
|---|---|---|
| CN | 102931322 A | 2/2013 |
| CN | 104836117 A | 8/2015 |

* cited by examiner

MICRO-LED TRANSFER METHOD AND MANUFACTURING METHOD

CROSS-REFERENCE TO RELATED APPLICATION(S)

This application is a U.S. National Stage of International Application No. PCT/CN2016/071474, filed on Jan. 20, 2016, which is hereby incorporated by reference in its entirety.

FIELD OF THE INVENTION

The present invention relates to the technical field of micro-LED, and in particular, relates to a micro-LED transfer method and a method for manufacturing a micro-LED device.

BACKGROUND OF THE INVENTION

The micro-LED technology refers to the LED array of small size integrated on a substrate with high density. Currently, the micro-LED technology is under development, and it is expected in the industry that a high-quality micro-LED product comes into the market. High-quality micro-LED will have a deep affection on the conventional display products such as LCD/OLED that have already been put into the market.

Until now, how to transfer micro-LEDs to a receiving substrate of a micro-LED device has always been a technical task to be improved by a technician.

In the prior art, a pickup head is used to transfer micro-LEDs. The approaches using pickup heads are relatively complicated and have problems in the aspects of yield and stability.

For example, the U.S. Pat. No. 8,333,860B1 discloses a micro device transfer head and a method of transferring one or more micro devices to a receiving substrate. This patent is hereby incorporated herein as a whole as a reference.

The U.S. Pat. No. 8,426,227B1 discloses a micro light emitting diode LED and a method of forming an array of micro LEDs for transfer to a receiving substrate. This patent is hereby incorporated herein as a whole as a reference.

SUMMARY OF THE INVENTION

One object of this invention is to provide a new technical solution for micro-LED transfer.

According to a first aspect of the present invention, there is provided a micro-LED transfer method, comprising: forming a sacrificial post on a micro-LED to be picked-up on a carrier substrate; bonding the micro-LED to be picked-up with a pickup substrate via the sacrificial post; lifting-off the micro-LED to be picked-up from the carrier substrate; bonding the micro-LED on the pickup substrate with a receiving substrate; and lifting-off the micro-LED from the pickup substrate.

Preferably, forming a sacrificial post includes: forming a sacrificial layer on the carrier substrate having micro-LEDs; patterning the sacrificial layer through photo lithography to keep the sacrificial layer on the micro-LED to be picked-up while removing the sacrificial layer on other portion, so as to form the sacrificial post.

Preferably, micro-LEDs are bonded with the carrier substrate through a first bonding layer, the micro-LED to picked-up is bonded with the pickup substrate via the sacrificial post through a second bonding layer, and the micro-LED picked-up by the pickup substrate is bonded with the receiving substrate through a third bonding layer.

Preferably, the first bonding layer and the second bonding layer are solder layers or adhesive layers, and the second bonding layer is of polymer.

Preferably, the lifting-off characteristics of the first bonding layer and the second bonding layer are different from that of the second bonding layer.

Preferably, the melting point of the first bonding layer is lower than 280° C., and the micro-LEDs to be picked up are lifted-off from the carrier substrate through heating.

Preferably, the second bonding layer is a photo resist, a thermal release tape, or an UV curable and laser de-bondable film.

Preferably, the micro-LED is lifted-off from the pickup substrate through at least one of solvent dissolving, thermal release, optical release, and mechanical release.

Preferably, the material of the pickup substrate includes one of glass, sapphire, quartz and silicon.

According to a second aspect of the present invention, there is provided method for manufacturing a micro-LED device, comprising transferring micro-LEDs to a receiving substrate of the micro-LED device by using the micro-LED transfer method of the present invention.

Compared with the prior art, the complicated pickup head is not necessary in this invention, and the technical solution of this invention is relatively simple. So, the task to be implemented by or the technical problem to be solved by the present invention has not been conceived or anticipated by a person skilled in the art and thus the present invention is a new solution.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
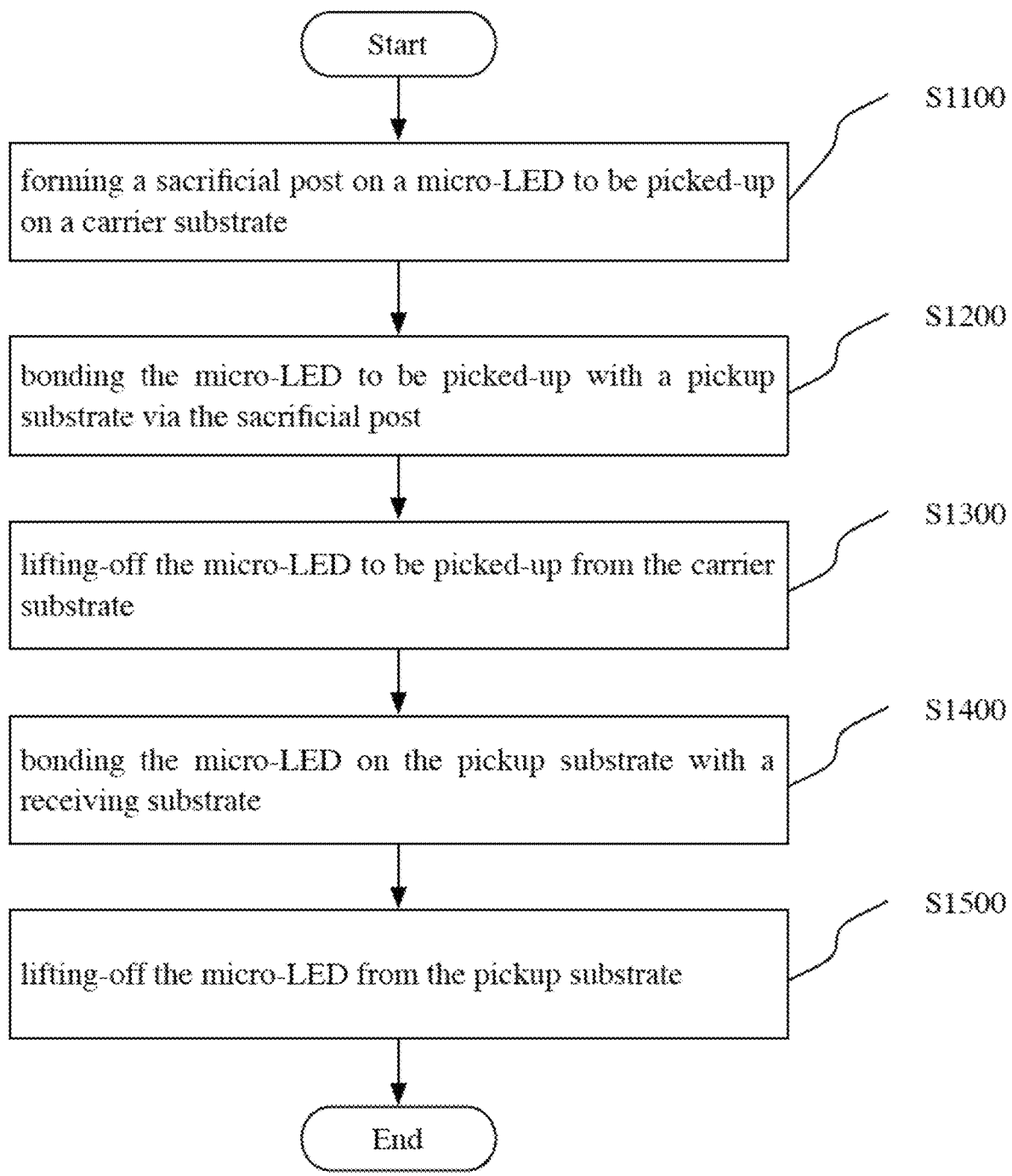
FIG. 1 is a flow chart of the method according to an embodiment of the present invention.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Below, the embodiments and examples will be described with reference to the accompany figures.

FIG. 1 shows the flow chart of a micro-LED transfer method according to an embodiment of the present invention.

As show in FIG. 1, at step S1100, a sacrificial post is formed on a micro-LED to be picked-up on a carrier substrate.

For example, the micro-LEDs can be lateral micro-LEDs or vertical micro-LEDs. The side-length of the micro-LEDs can be 1-100 μm.

A person skilled in the art could conceive many approaches for forming a sacrificial post. For example, a sacrificial post can be formed by an ink-injection approach. Preferably, in an embodiment, a sacrificial layer can be formed on the carrier substrate having micro-LEDs; and the sacrificial layer is patterned through photo lithography to keep the sacrificial layer on the micro-LED to be picked-up while removing the sacrificial layer on other portion, so as to form the sacrificial post.

For example, the micro-LEDs are bonded with the carrier substrate through a first bonding layer. The first bonding layer can be a solder layer or an adhesive layer.

At step S1200, the micro-LED to be picked-up is bonded with a pickup substrate via the sacrificial post.

Since the sacrificial post is higher than the micro-LEDs, only the micro-LED to be picked-up is bonded with the pickup substrate via the sacrificial post. For example, the micro-LED to be picked-up is bonded with the pickup substrate via the sacrificial post through a second bonding layer. For example, the second bonding layer can be a polymer layer, such as a photo resist, a thermal release tape, or an UV curable and laser de-bondable film etc.

The material of the pickup substrate can include one of glass, sapphire, quartz and silicon.

At step S1300, the micro-LED to be picked-up is lifted-off from the carrier substrate.

The lifting-off from the carrier substrate can be carried out through thermal release. For example, the first bonding layer is a solder layer, and the solder is a metal or alloy with a relatively low melting point, or the combination thereof. Preferably, the melting point of the solder is lower than 280° C.; more preferably, lower than 200° C.; and even more preferably, lower than 160° C. As such, the lifting-off can be carried out by heating.

At step S1400, the micro-LED on the pickup substrate is bonded with a receiving substrate.

For example, the micro-LED picked-up by the pickup substrate can be bonded with the receiving substrate through a third bonding layer. The third bonding layer can be a solder layer or an adhesive layer.

At step S1500, the micro-LED is lifted-off from the pickup substrate.

For example, the micro-LED can be lifted-off from the pickup substrate through at least one of solvent dissolving, thermal release, optical release, and mechanical release. In this step, the sacrificial post can be removed or can be kept, as demand.

Based on the teaching of the present invention, a person skilled in the art would easily understand that the technical solution of the present invention per se has already indicated that the micro-LEDs can remain on the second bonding layer (the pickup substrate) when being lifted-off from the first bonding layer (the carrier substrate), and the micro-LEDs can remain on the third bonding layer (the receiving substrate) when being lifted-off from the second bonding layer (the pickup substrate). For example, the lifting-off characteristic of the first bonding layer is different from that of the second bonding layer, so that the micro-LEDs can be transferred from the carrier substrate to the pickup substrate. Furthermore, the lifting-off characteristic of the second bonding layer is different from that of the third bonding layer, so that the micro-LEDs can be transferred from the pickup substrate to the receiving substrate. The lifting-off characteristic can include lifting-off temperature, lifting-off approach and so on.

For example, the micro-LEDs can be lifted-off form the carrier substrate through heating, and can be lifted-off from the pickup substrate through a laser lifting-off.

In an example, the first bonding layer is a solder layer with low melting point, the second bonding layer is a polymer layer, and the third bonding layer is a solder layer having a relatively high melting point after bonding. In this situation, the first bonding layer can be lifted-off through heating at a first temperature, and the second bonding layer can be lifted-off thought heating at a second temperature, wherein the first temperature is lower than the second temperature.

In a preferable embodiment, alternatively, a contactless manner can be used for performing the lifting-off or assisting the lifting-off. For example, when lifting-off, the micro-LEDs are kept on the pickup substrate or the receiving substrate through at least one of gravity, electrostatic force or magnetic force. The electrostatic force can be applied via the pads or bonding layers on the pickup substrate or the receiving substrate, for example. The magnetic force can be applied from the side of the pickup substrate or the receiving substrate, for example. The contactless lifting-off manner can be combined with other lifting-off manners such as heating lift-off, laser lifting-off and so on, to further improve the performance of lifting-off.

In the case where the present invention has already taught that the first bonding layer and the second bonding layer are to be lifted-off individually, this teaching is sufficient for a person skilled in the art to readily conceive a lot of manners to individually lift-off the bonding layers, even if some of the manners are inventive. Thus, the detailed descriptions for various specific lifting-off approaches are omitted in this specification.

Compared with the technique of pickup head in the prior art, the present invention does not need the manufacturing of a complicated pickup head, and thus the technical solution of the present invention is relatively simple. This can further reduce the cost to a certain degree.

Furthermore, the pickup substrates rather than pickup head arrays can easily be used for a large scale processing. So, the yield can be improved by the present invention.

Furthermore, compared with the electrostatic pickup of a pickup head, the present invention can improve the stability of pickup to a certain degree.

In another embodiment, the present invention can further include a method for manufacturing a micro-LED device. The manufacturing method comprises transferring micro-LEDs to a receiving substrate of the micro-LED device by using the above micro-LED transfer method. The micro-LED device is a display screen device, for example, and the receiving substrate is a display panel or a display substrate, for example.

Furthermore, the present invention can further include the micro-LED device manufactured by the above manufacturing method and/or an electronics apparatus comprising said micro-LED device, such as a mobile phone, pad and so on.

FIGS. 2-14 show an example for micro-LED transfer according to the present invention.

Figure 2:
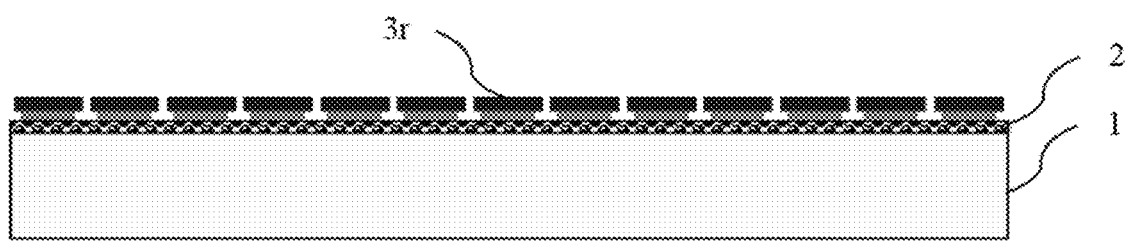
FIGS. 2-14 is a schematic diagram of an example for micro-LED transfer according to the present invention.

As shown in FIG. 2, red micro-LEDs 3r are bonded on the carrier substrate 1 through a first bonding layer 2. The first bonding layer 2 is, for example, a solder layer or an adhesive tape layer. The micro-LEDs can include p-metal, trench, dielectric and so on. For example, the micro-LEDs can be firstly formed on a growth substrate and then be transferred to the carrier substrate from the growth substrate.

Figure 3:
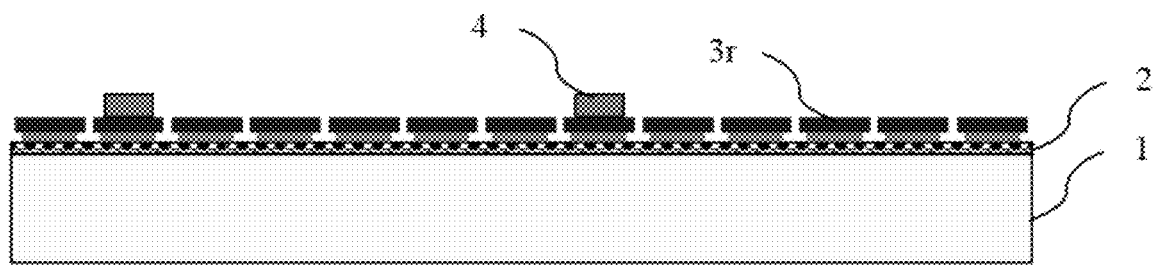

As shown in FIG. 3, sacrificial posts 4 are formed on the micro-LEDs to be picked-up on the carrier substrate 1. The sacrificial posts 4 can be formed through many approaches, such as an ink-injection approach. Preferably, a sacrificial layer can firstly be formed on the micro-LEDs on the carrier substrate 1, and then the sacrificial layer is patterned through photo lithography to keep the sacrificial layer on the micro-LEDs to be picked-up while removing the sacrificial layer on other portion, so as to form the sacrificial posts 4. For example, the sacrificial posts can be photo resist. It can withstand a temperature of at least 160° C. and can be removed through Acetone or RR4 etchant.

Figure 4:
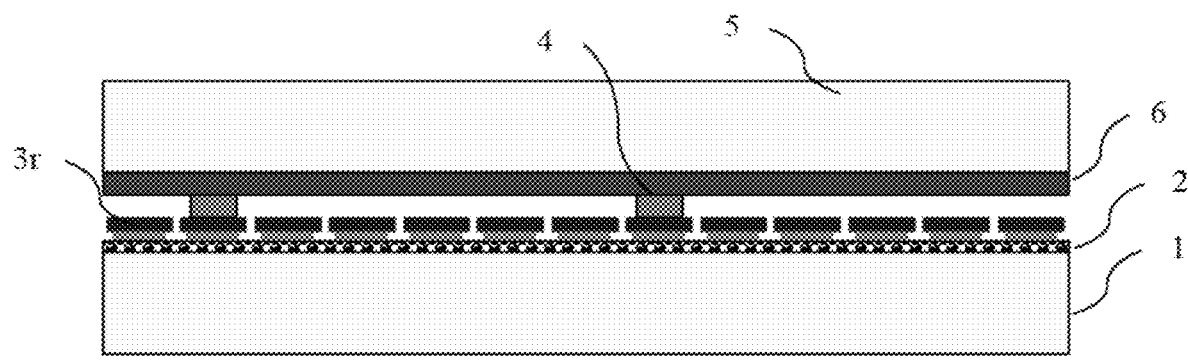

As shown in FIG. 4, the micro-LEDs 3r to be picked-up are bonded onto a pickup substrate 5 through a second bonding layer 6 via the sacrificial posts 4.

The material of the second bonding layer 6 can be bonding polymer. The bonding polymer can, for example, be an UV curable and laser de-bondable film (such as 3M LC5320 available in the market), a thermal release tape, a high temperature UV tape (such as the UV releasable two-sides tape of Nitto Denko), or a photo resist same as or different from the sacrificial posts.

Figure 5:
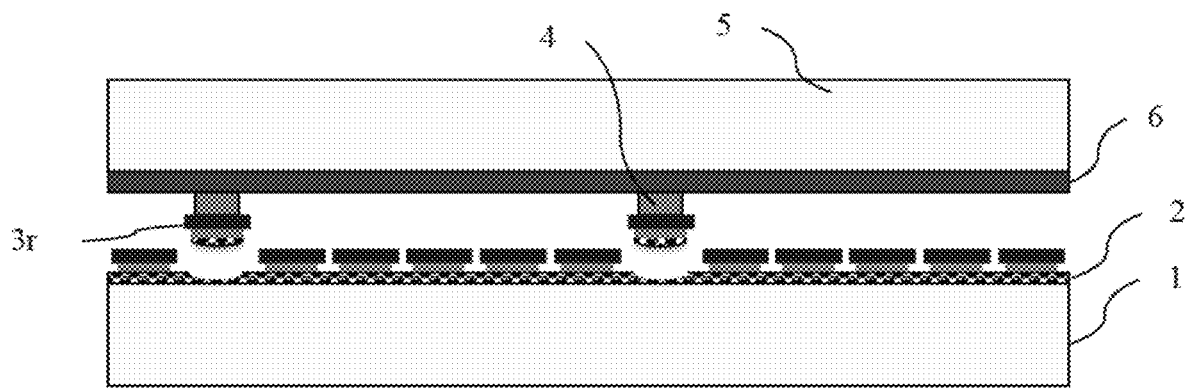

As shown in FIG. 5, the micro-LEDs 3r to be picked-up are lifted-off from the carrier substrate 1. For example, the first bonding layer 2 is a solder layer with relatively low melting point. The solder of the first bonding layer 2 is melted through heating, and then the pickup substrate 5 is lifted up to lift-off the micro-LEDs to be picked up.

Figure 6:
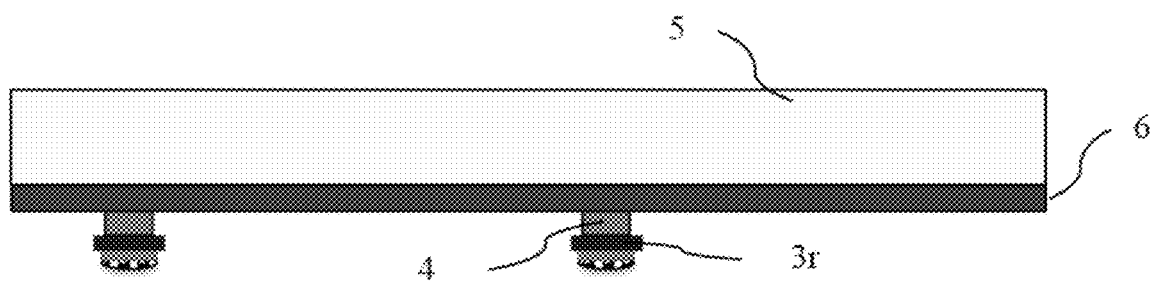
Figure 7:
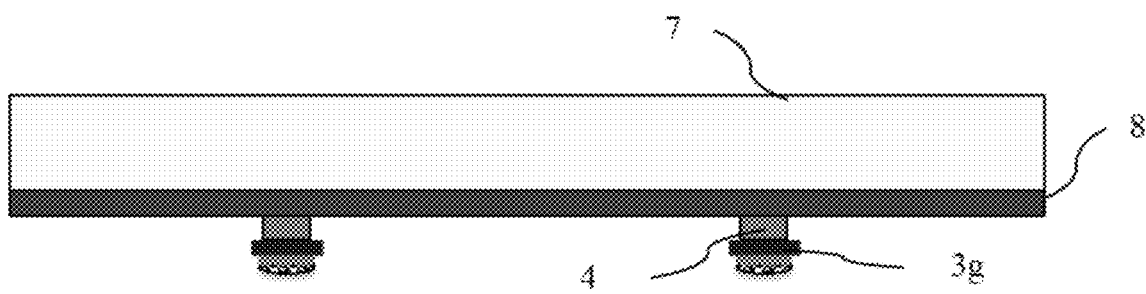
Figure 8:
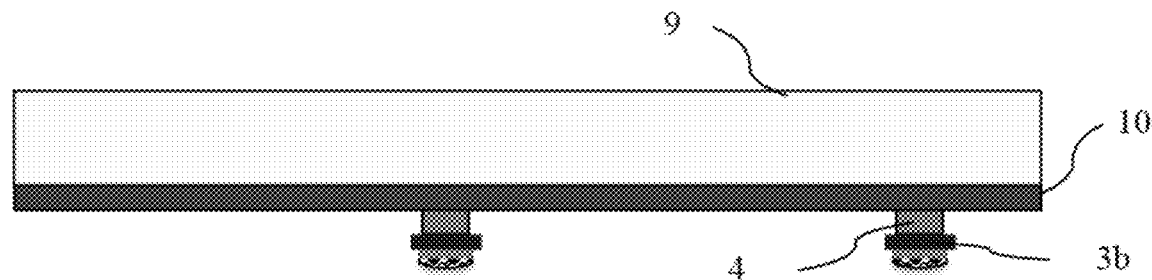

As shown in FIG. 6, the red micro-LEDs 3r are picked up by the pickup substrate 5. As shown in FIGS. 7 and 8, the above steps can be repeated to pick up green micro-LEDs 3g and blue micro-LEDs 3b, wherein the green micro-LEDs 3g are bonded with a pickup substrate 7 through a second bonding layer 8 in FIG. 7 and the blue micro-LEDs 3b are bonded with a pickup substrate 9 through a second bonding layer 10 in FIG. 8.

Figure 9:
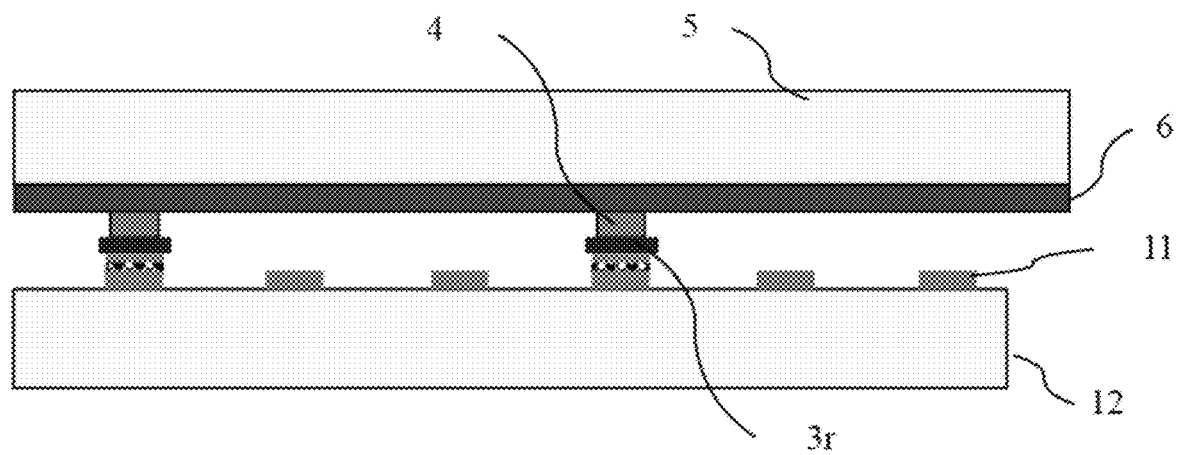
Figure 10:
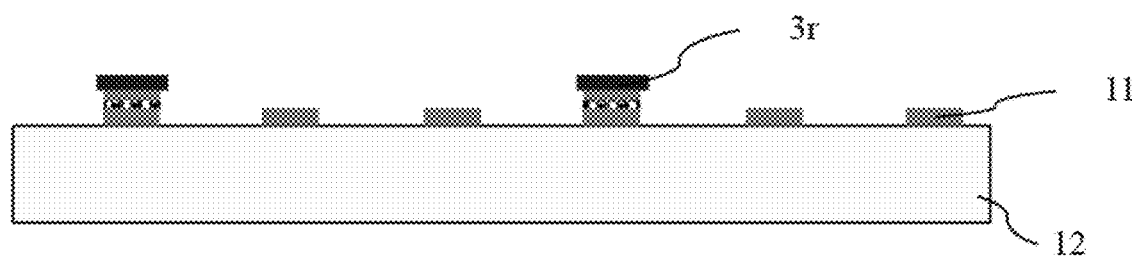

As shown in FIG. 9, the micro-LEDs 3r on the pickup substrate 5 are bonded with a receiving substrate 12 through a third bonding layer 11. As shown in FIG. 10, the micro-LEDs 3r are lifted-off from the pickup substrate 5. For example, the micro-LED 3r can be lifted-off by laser lifting-off, thermal release, etchant and so on. As such, the red micro-LED 3r are transferred to the receiving substrate 12.

Figure 11:
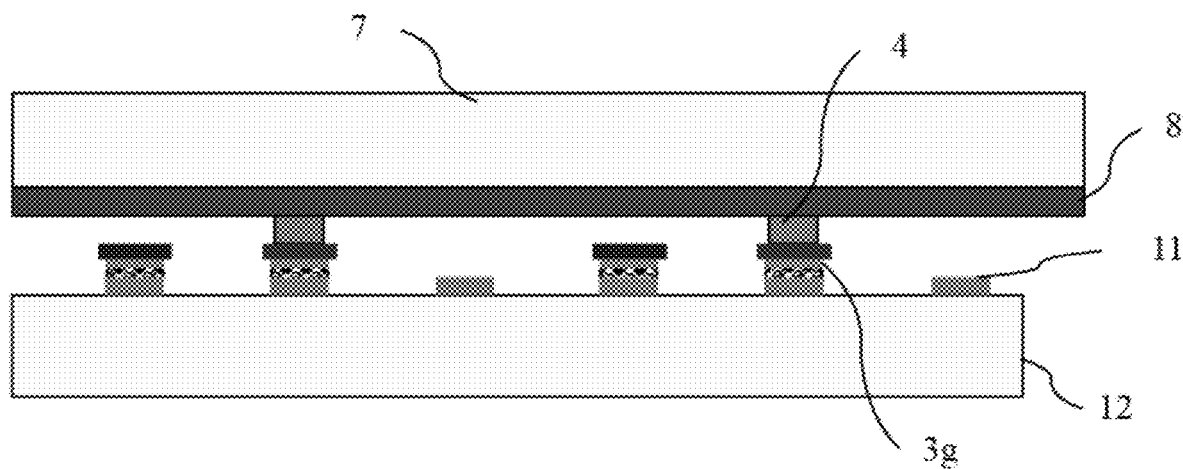
Figure 12:
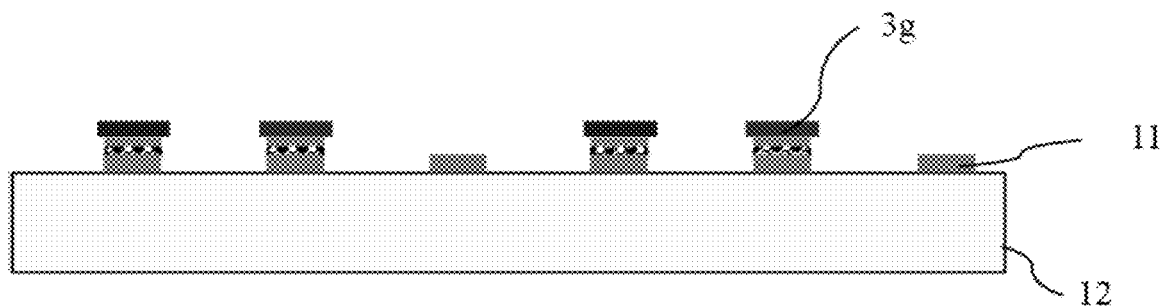

As shown in FIGS. 11 and 12, the green micro-LEDs 3g can be transferred to the receiving substrate 12 by using the same approach.

Figure 13:
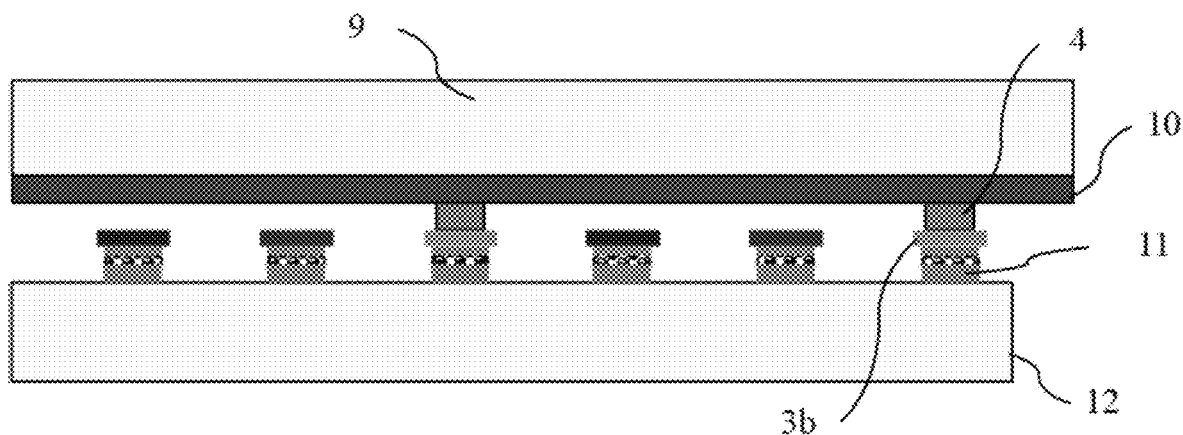
Figure 14:
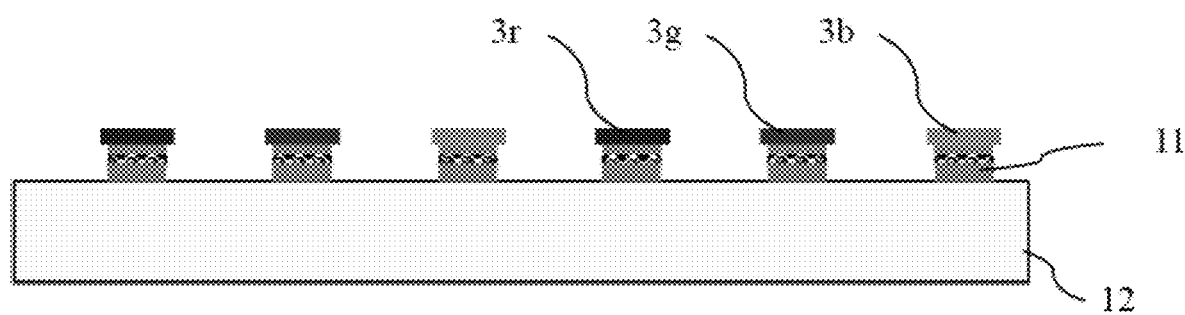

As shown in FIGS. 13 and 14, the blue micro-LEDs 3b can be transferred to the receiving substrate 12 by using the same approach.

In an example, in order to remedy the faults of certain micro-LEDs, redundant micro-LEDs can be provided by using redundant technique. As such, when a certain micro-LED does not work, a redundant micro-LED corresponding to it can be used, thereby improving the quality of a display device.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A micro-LED transfer method, comprising:
   forming a sacrificial post on a micro-LED to be picked-up on a carrier substrate;
   bonding the micro-LED to be picked-up with a pickup substrate via the sacrificial post;
   lifting-off the micro-LED to be picked-up from the carrier substrate;
   bonding the micro-LED on the pickup substrate with a receiving substrate; and
   lifting-off the micro-LED from the pickup substrate,
   wherein forming a sacrificial post includes:
   forming a sacrificial layer on the carrier substrate having micro-LEDs;
   patterning the sacrificial layer through photo lithography to keep the sacrificial layer on the micro-LED to be picked-up while removing the sacrificial layer on other portion, so as to form the sacrificial post, such that the sacrificial post is positioned above and higher than the micro-LEDs, so only the micro-LED desired to be picked-up is bonded with the pickup substrate via the sacrificial post.

2. The method according to claim 1, wherein micro-LEDs are bonded with the carrier substrate through a first bonding layer, the micro-LED to be picked-up is bonded with the pickup substrate via the sacrificial post through a second bonding layer, and the micro-LED picked-up by the pickup substrate is bonded with the receiving substrate through a third bonding layer.

3. The method according to claim 2, wherein the first bonding layer and the second bonding layer are solder layers or adhesive layers, and the second bonding layer is of polymer.

4. The method according to claim 2, wherein the lifting-off characteristics of the first bonding layer and the second bonding layer are different from that of the second bonding layer.

5. The method according to claim 2, wherein the melting point of the first bonding layer is lower than 280° C., and the micro-LEDs to be picked up are lifted-off from the carrier substrate through heating.

6. The method according to claim 2, wherein the second bonding layer is a photo resist, a thermal release tape, or an UV curable and laser de-bondable film.

7. The method according to claim 1, wherein the micro-LED is lifted-off from the pickup substrate through at least one of solvent dissolving, thermal release, optical release, and mechanical release.

8. The method according to claim 1, wherein the material of the pickup substrate includes one of glass, sapphire, quartz and silicon.

9. A method for manufacturing a micro-LED device, comprising transferring micro-LEDs to a receiving substrate of the micro-LED device by using the method according to claim 1.

\* \* \* \* \*